United States Patent
Jiao et al.

(10) Patent No.: US 9,478,769 B2
(45) Date of Patent: Oct. 25, 2016

(54) DISPLAY BACK PLATE AND MANUFACTURING METHOD THEREFOR, AND DISPLAY DEVICE

(71) Applicant: BOE Technology Group Co., Ltd., Beijing (CN)

(72) Inventors: Zhiqiang Jiao, Beijing (CN); Li Sun, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 14/421,389

(22) PCT Filed: Mar. 19, 2014

(86) PCT No.: PCT/CN2014/073682
§ 371 (c)(1),
(2) Date: Feb. 12, 2015

(87) PCT Pub. No.: WO2015/123906
PCT Pub. Date: Aug. 27, 2015

(65) Prior Publication Data
US 2015/0372256 A1 Dec. 24, 2015

(30) Foreign Application Priority Data
Feb. 18, 2014 (CN) .......................... 2014 1 0055236

(51) Int. Cl.
*H01L 27/32* (2006.01)
*H01L 51/52* (2006.01)
*H01L 51/56* (2006.01)

(52) U.S. Cl.
CPC ....... *H01L 51/5253* (2013.01); *H01L 27/3246* (2013.01); *H01L 51/5259* (2013.01); *H01L 51/56* (2013.01)

(58) Field of Classification Search
CPC ........... H01L 27/3246; H01L 51/5237; H01L 51/5259
See application file for complete search history.

(56) References Cited

U.S. PATENT DOCUMENTS 7,005,799 B2 * 2/2006 Booth, Jr. ........... H01L 51/5237
313/506

(Continued)

FOREIGN PATENT DOCUMENTS

| CN | 1638549 A | 7/2005 |
| CN | 1992157 A | 7/2007 |

(Continued)

OTHER PUBLICATIONS

International Search Report for PCT Application No. PCT/CN2014/073682, dated Nov. 19, 2014, 10 pages.

(Continued)

*Primary Examiner* — John C Ingham
(74) *Attorney, Agent, or Firm* — Westman, Champlin & Koehler, P.A.

(57) ABSTRACT

Embodiments of the present invention disclose a display back plate. The display back plate comprises: an array substrate; and a pixel define layer formed on the array substrate and for defining an organic light emitting unit. An accommodation space is provided in the pixel define layer and a water absorbent material is provided within the accommodation space; the accommodation space has an opening formed in an upper surface and/or a lower surface of the pixel define layer; and the accommodation space is separated from the organic light emitting unit such that the water absorbent material within the accommodation space is spaced away from the organic light emitting unit. Embodiments of the present invention enable absorption of water vapor inside the organic light emitting display device, to prevent the adverse affection of water vapor on performance of the organic light emitting display device, so as to prolong service life of the organic light emitting display device.

14 Claims, 7 Drawing Sheets

(56) References Cited

U.S. PATENT DOCUMENTS

| | | | | |
|---|---|---|---|---|
| 8,975,621 | B2* | 3/2015 | Kim | H01L 27/3274 257/291 |
| 2003/0190763 | A1* | 10/2003 | Cok | H01L 27/3211 438/22 |
| 2007/0159096 | A1 | 7/2007 | Oh et al. | |
| 2007/0172971 | A1 | 7/2007 | Boroson | |
| 2008/0239637 | A1 | 10/2008 | Sung et al. | |
| 2010/0102302 | A1 | 4/2010 | Kase et al. | |

FOREIGN PATENT DOCUMENTS

| CN | 102648543 A | 8/2012 |
|---|---|---|
| CN | 203134869 U | 8/2013 |
| CN | 203707190 U | 7/2014 |
| TW | 200826728 A | 6/2008 |

OTHER PUBLICATIONS

First Chinese Office Action, including Search Report, for Chinese Patent Application No. 201410055236.5, dated Sep. 17, 2015, 10 pages.

English translation of Box No. V of the Written Opinion for the International Searching Authority for International Application No. PCT/CN2014/073682, 5 pages.

* cited by examiner

DISPLAY BACK PLATE AND MANUFACTURING METHOD THEREFOR, AND DISPLAY DEVICE

CROSS-REFERENCE TO RELATED APPLICATION

This application is a Section 371 National Stage Application of International Application No. PCT/CN2014/073682, filed 19 Mar. 2014, which has not yet published, and claims priority to Chinese Patent Application No. 201410055236.5, filed on Feb. 18, 2014, in Chinese, the contents of which are hereby incorporated by reference in their entirety.

BACKGROUND OF THE INVENTION

1. Field of the Invention

Embodiments of the present invention relate to field of display manufacturing technology, and more particularly, to a display back plate and a manufacturing method therefor, and a display device.

2. Description of the Related Art

A small molecular organic light emitting diode (OLED)-based organic light emitting display device or a polymer light-emitting diode (PLED)-based organic light emitting display device becomes mainstream products in the field of display, due to their characteristics of self-illumination, quick-response and wide viewing angle, etc.

In the OLED-based or PLED-based organic light emitting display device, a display back plate generally comprises a TFT array substrate, a pixel define layer (PDL) arranged over the array substrate, several organic light emitting units (such as OLEDs or PLEDs) defined by the pixel define layer, and a packaging layer as the topmost layer, wherein the organic light emitting unit is generally consisted of a positive electrode, a hole transport layer, a light emitting layer, an electron transport layer (ETL) and a negative electrode. Moreover, service life of the organic light emitting display device mostly depends on whether or not the organic light emitting units are in touch with water vapour and oxygen. If packages of the organic light emitting display devices are not adequate, some components in the air, such as water vapour and oxygen, may permeate into the organic light emitting display devices, which increases a performance function of the negative electrode of the organic light emitting unit, thereby adversely affecting service life of the organic light emitting display device. In addition, water vapour will make a chemical reaction with the hole transport layer and the electron transport layer, which adversely affects the service life of the organic light emitting display device. Accordingly, adequate packages of these organic light emitting units separate respective functional layers in the organic light emitting display device from components in the air, such as water vapour and oxygen, which can effectively prolong the service life of the organic light emitting display device.

The existing organic light emitting display device is usually hermetically packaged within an inert gas environment such as $N_2$. Drying agent is provided over the packaging layer to prevent water vapour in the air from permeating into the organic light emitting components, so as to effectively prolong the service lifes of the organic light emitting components. However, some parts, such as thin film transistor on the array substrate, color film, etc., inside the organic light emitting display device can generate gases, liking water vapours. Water vapours generated from these interior parts still adversely affect the service lifes of the organic light emitting components.

SUMMARY OF THE INVENTION

The present invention has been made to overcome or alleviate at least one aspect of the above mentioned disadvantages existing in the conventional technical solutions.

Accordingly, it is an object of the present invention to provide a display back plate and a manufacturing method therefor and a display device, which prevent the adverse affection of water vapour on performance of the conventional organic light emitting display device.

According to an aspect of the present invention, there is provided a display back plate. The display back plate comprises: an array substrate; and a pixel define layer formed on the array substrate and for defining an organic light emitting unit; wherein an accommodation space is provided in the pixel define layer and within which a water absorbent material is provided; the accommodation space has an opening formed on an upper surface and/or a lower surface of the pixel define layer; and the accommodation space is separated from the organic light emitting unit such that the water absorbent material within the accommodation space is spaced away from the organic light emitting unit.

According to another aspect of the present invention, there is provided a display device comprising the above-mentioned display back plate.

According to another aspect of the present invention, there is provided a manufacturing method for a display back plate. The method comprises:

providing an array substrate;

forming a first film layer having an absorbent performance on the array substrate, wherein the first film layer is patterned in accordance with a predetermined pattern; and forming a pixel define layer on the patterned first film layer, the pixel define layer enveloping on the patterned first film layer such that an accommodation space corresponding to the patterned first film layer is formed in the pixel define layer;

wherein, the accommodation space is separated from the organic light emitting unit in the pixel define layer such that the absorbent first film layer accommodated within the accommodation space is spaced away from the organic light emitting unit.

According to another aspect of the present invention, there is provided a manufacturing method for a display back plate. The method comprises:

providing an array substrate; and forming, on the array substrate, a pixel define layer having an accommodation space, and, providing a water absorbent material within the accommodation space;

wherein, the accommodation space has an opening formed on an upper surface and/or a lower surface of the pixel define layer; and wherein, the accommodation space is separated from the organic light emitting unit in the pixel define layer such that the water absorbent material within the accommodation space is spaced away from the organic light emitting unit.

In these embodiments of the present invention, the pixel define layer is formed with the accommodation space therein, and the accommodation space is filled with the water absorbent material, as a result, it enables a good absorption of water vapour inside the display device.

The above and other features of the present invention will become more apparent by describing in detail exemplary embodiments thereof with reference to the accompanying drawings.

DETAILED DESCRIPTION OF PREFERRED EMBODIMENTS OF THE INVENTION

Figure 1A:
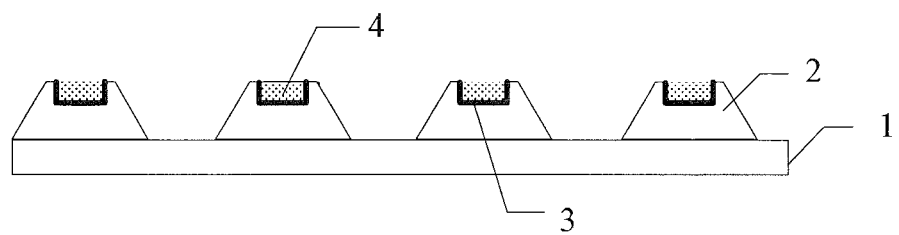
FIGS. 1A-1C are structure schematic views of a pixel define layer formed with accommodation spaces according to an embodiment of the present invention.

Exemplary embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments are provided so that the present invention will be thorough and complete, and will fully convey the concept of the disclosure to those skilled in the art.

First Embodiment

Figure 1B:
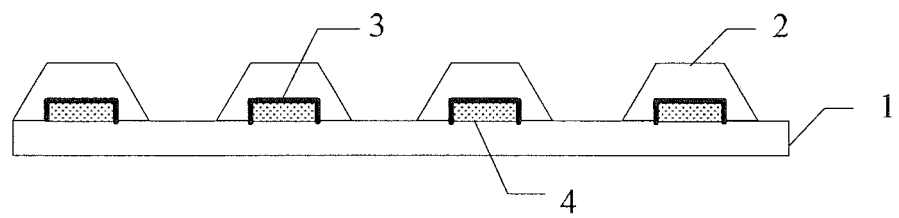
Figure 1C:
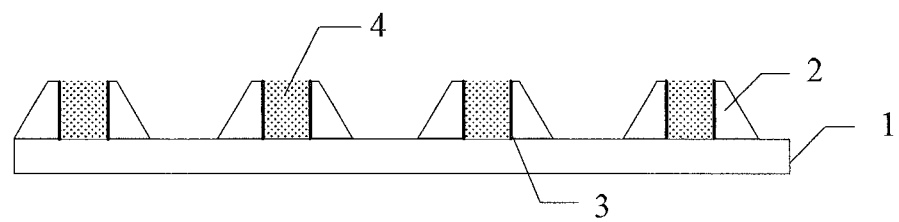

According to the first embodiment of the present invention, a display back plate is provided. Referring to FIGS. 1A, 1B and 1C, the display back plate comprises an array substrate 1, and a pixel define layer 2 for defining organic light emitting units. The pixel define layer is provided with an accommodation space 3 therein, and a water absorbent material 4 is provided inside the accommodation space 3.

Specifically, as shown in FIGS. 1A, 1B and 1C, in the present embodiment, the accommodation space 3 has an opening formed in an upper surface and/or a lower surface of the pixel define layer 2. The accommodation space 3 is separated from the organic light emitting unit 7 (see FIG. 6) such that the water absorbent material 4 inside the accommodation space 4 is spaced away from the organic light emitting unit 7.

It should be noted that, the shape, number and location of the accommodation space 3 according to the present embodiment shown in FIGS. 1A, 1B and 1C are only for representative purpose and should not be limited to those in the embodiment set forth herein. For example, there may be a number of discrete accommodation spaces 3 according to other embodiment of the present invention.

In the structure schematic view of the pixel define layer shown in FIG. 1A, the accommodation space 3 partially runs through the pixel define layer and has an opening formed in the upper surface of the pixel define layer. As a result, the water absorbent material placed inside the accommodation space 3 enables good absorptions of water vapour emitted by a film layer at an upper part of the inside of the organic light emitting display device and water vapour permeated into the inside of the organic light emitting display device from the outside air.

In the structure schematic view of the pixel define layer shown in FIG. 1B, the accommodation space 3 is provided in the lower surface (a side being in contact with the array substrate 1) of the pixel define layer. The accommodation space 3 partially runs through the pixel define layer and has an opening formed in the lower surface of the pixel define layer, and the accommodation space 3 is provided with the water absorbent material 4 therein. As a result, the water absorbent material enables a good absorption of water vapour emitted from the components on the array substrate 1.

In the structure schematic view of the pixel define layer shown in FIG. 1C, the accommodation space 3 completely runs through the pixel define layer 2. As a result, the water absorbent material placed inside the accommodation space 3 enables a good absorption of water vapour inside the organic light emitting display device.

In one embodiment of the present invention, the array substrate 1 generally comprises a supporting base and a thin film transistor (TFT). The supporting base may be embodied as a transparent one, or may be embodied as a non-transparent one, for example, the non-transparent supporting base for a top emission type organic light emitting display device is made of, e.g, ceramic, metal, etc. The thin film transistor may be embodied as oxide thin film transistor, or may be embodied as low temperature poly-silicon thin film transistor or amorphous silicon thin film transistor.

According to embodiments of the present invention, structure of the array substrate 1 is not limited. The thin film transistor used in the array substrate 1 may have a bottom gate structure, a top gat structure, an overlapping type structure, an anti-overlapping type structure, a coplanar type structure or an anti-coplanar type structure, etc.

In one embodiment of the present invention, the water absorbent material 4 may be desiccant of metal oxide, e.g., calcium oxide (CaO), magnesium oxide (MgO) or barium oxide (BaO), etc., or may be desiccant of organic material, or may be the material for forming the pixel define layer, which is mixed with the above metal oxide(s).

Figure 2A:
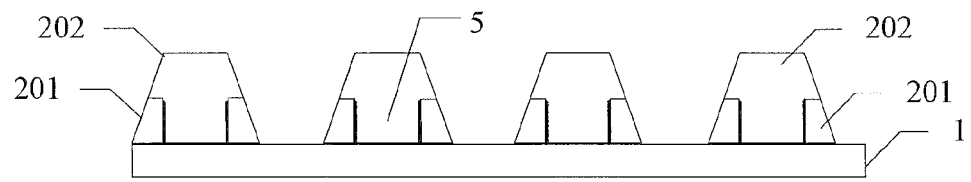
FIGS. 2A-2B are structure schematic views of a pixel define layer according to an embodiment of the present invention, in which each accommodation space is formed by one first via hole.
Figure 2B:
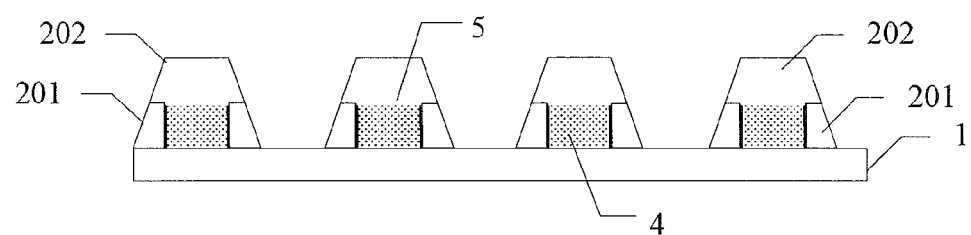

In one embodiment of the present invention, material for the pixel define layer 2 may be Acrylic material, or may be resin material. In an embodiment of the present invention, as shown in FIG. 2A, the pixel define layer 2 may comprise a first pixel define layer 201 and a second pixel define layer 202 provided on the array substrate 1 successively from the bottom up. In an embodiment of the present invention, in order to enable a good absorption of water vapour emitted from the array substrate by the water absorbent material, preferably, the accommodation space 3 comprises a first via hole 5 running through the first pixel define layer 201 along a direction perpendicular to the array substrate, as shown in FIG. 2A. The second pixel define layer 202 is made after placing the water absorbent material 4 into the first via hole 5, as a result, the pixel define layer shown in the structure schematic view of FIG. 2B is achieved. In the present embodiment, the first via hole 5 is formed in the first pixel define layer 201, while no via hole is formed in the second pixel define layer 202. As a result, the structure of the pixel define layer shown in FIGS. 2A and 2B may be achieved by directly forming the first via hole 5 through a patterning process after manufacturing the first pixel define layer 201.

Figure 3A:
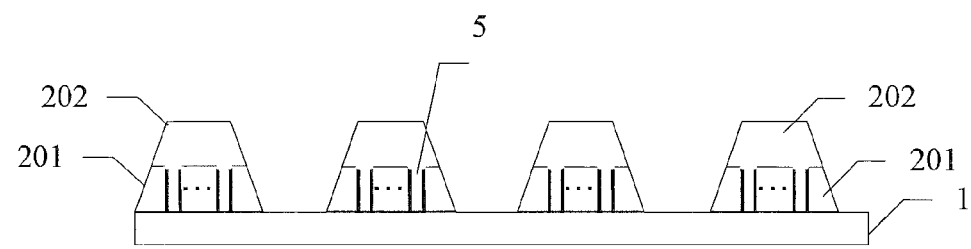
FIGS. 3A-3B are structure schematic views of a pixel define layer according to an embodiment of the present invention, in which each accommodation space is formed by a plurality of first via holes.
Figure 3B:
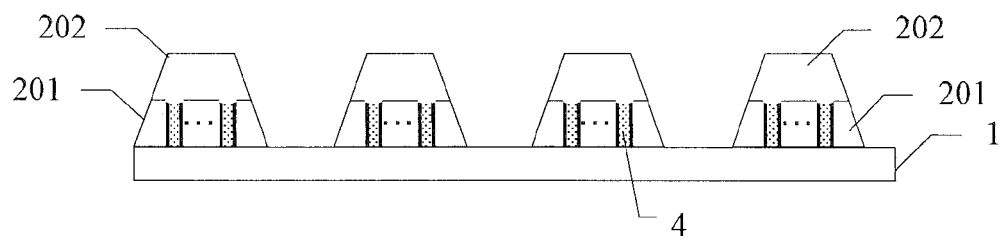

In another embodiment of the present invention, each accommodation space of the first pixel define layer 201 may comprise a plurality of first via holes 5, and the water absorbent materials 4 are placed within the first via holes 5. FIG. 3A is a structure schematic view of a pixel define layer according to an embodiment of the present invention, in which each accommodation space is formed by a plurality of first via holes 5; and, FIG. 3B is a structure schematic view of a pixel define layer according to an embodiment of the present invention, in which a second pixel define layer 202 is manufactured after placing the water absorbent materials 4 into the plurality of first via holes 5. As shown in FIGS. 3A and 3B, the first via holes 5 are formed in the first pixel define layer 201, while no via hole is formed in the second pixel define layer 202. As a result, the plurality of first via holes 5 may be directly formed through a patterning process after manufacturing the first pixel define layer 201.

In another embodiment of the present invention, each accommodation space of the first pixel define layer 201 may comprise at least one first via hole 5. The larger the number of the first via holes 5 is, and the larger the number of the water absorbent material 4 that are placed inside the first via holes is, so that the absorption effect of water vapour inside the organic light emitting display device is better. However, taking the practical process into consideration, preferably, each accommodation space of the first pixel define layer 201 comprises one first via hole 5, due to small size of the pixel define layer and small amount of water vapour emitted from the array substrate inside the organic light emitting display device. Accordingly, not only definitions of the organic light emitting units are achieved while keeping the size of the pixel, but also the absorption of water vapour inside the organic light emitting display device is enabled, without changing original size of the pixel define layer.

Figure 4A:
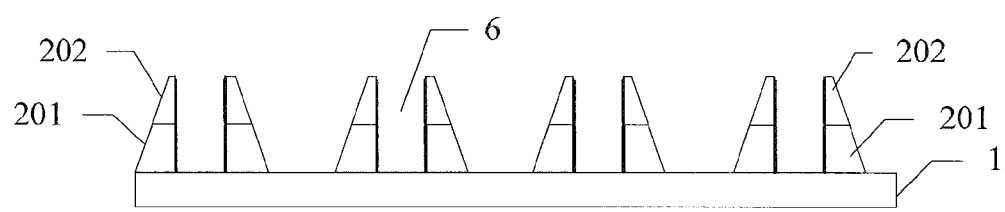
FIGS. 4A-4B are structure schematic views of a pixel define layer according to an embodiment of the present invention, in which each accommodation space is formed by one via hole.
Figure 4B:
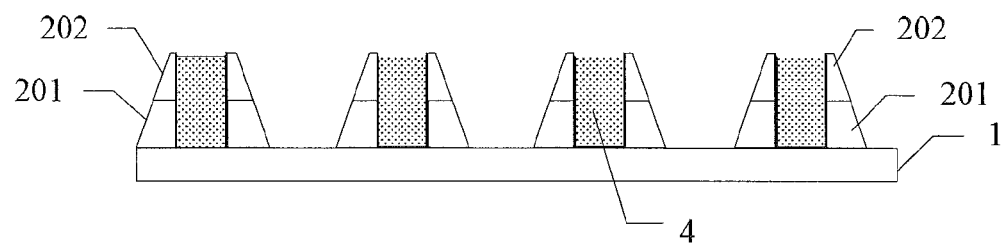

In another embodiment of the present invention, in order to enable a good absorption of water vapour inside the organic light emitting display device by using the water absorbent material provided within the accommodation space 3, preferably, the accommodation space 3 comprises a via hole completely running through the pixel define layer, that is, the original pixel define layer is divided into two independent portions by the accommodation space 3, referring to FIG. 1C. Of course, in the embodiment where the pixel define layer comprises the first pixel define layer 201 and the second pixel define layer 202, the accommodation space 3 is formed as a via hole 6 running through the first pixel define layer 201 and the second pixel define layer 202 along a direction perpendicular to the array substrate, as shown in FIG. 4A. And, FIG. 4B shows a structure schematic view where the water absorbent material 4 has been placed within the via hole 6. With such structure, the absorption of water vapour inside the display device is enabled by using the water absorbent material 4.

Figure 5A:
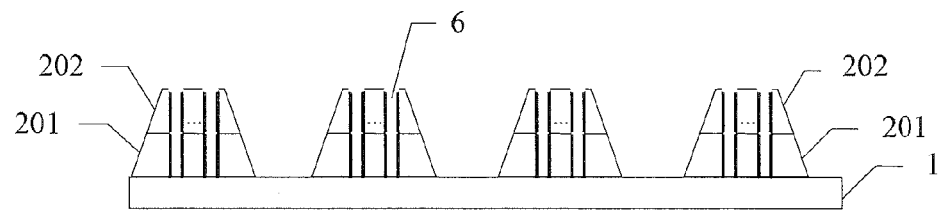
FIGS. 5A-5B are structure schematic views of a pixel define layer according to an embodiment of the present invention, in which each accommodation space is formed by a plurality of via holes.
Figure 5B:
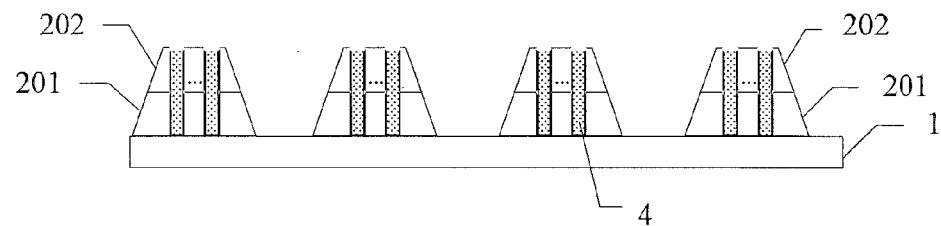

In one embodiment of the present invention, each accommodation space 3 may be formed of at least one via hole 6. FIG. 5A shows a structure of the pixel define layer where each accommodation space 3 is formed of a plurality of via holes 6. FIG. 5B shows the structure after the water absorbent materials 4 are provided within the plurality of via holes 6. The larger the number of the via holes 6 is, the number of the water absorbent materials 4 that are placed within the via holes is, so that the absorption effect of water vapour is better. However, taking the practical process into consideration, preferably, each accommodation space of the first pixel define layer 201 comprises one first via hole 5, due to small amount of water vapour generated inside the organic light emitting display device. In an embodiment of the present invention, each accommodation space 3 is formed of one via hole 6.

In the display back plate according to embodiments of the present invention, the accommodation space (e.g., the via hole) is formed in the pixel define layer and the water absorbent material is provided inside the accommodation space, accordingly, the display back plate according to embodiments of the present invention enables absorption of water vapour inside the organic light emitting display device, to prevent the adverse affection of water vapour on performance of the organic light emitting display device, so as to prolong service life of the organic light emitting display device.

Second Embodiment

Figure 6:
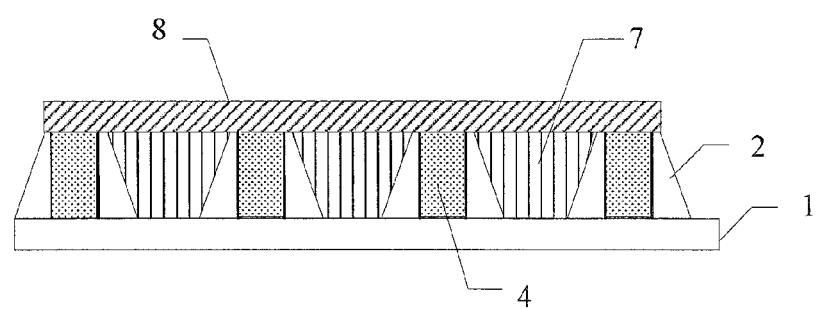
FIG. 6 is a structure schematic view of a display device according to an embodiment of the present invention.

According to the second embodiment of the present invention, a display device is provided. The display device comprises a display back plate according to the first embodiment, including the array substrate 1 and the pixel define layer 2 formed on the array substrate 1. The display device further comprises several organic light emitting units 7 defined by the pixel define layer 2, and a packaging layer 8, as shown in FIG. 6.

Structure of the display back plate according to the present embodiment is similar to that of the display back plate according to the first embodiment of the present invention, and the description thereof will be omitted.

It should be noted that, structures of the organic light emitting units of various types are not limited to those in the above embodiments of the present invention, and the organic light emitting unit may further comprise a hole injection layer, an electron injection layer, an electron blocking layer, a hole blocking layer, or the like.

Furthermore, a glass lid type package or thin film type package is used as the packaging layer 8, in order to seal the organic light emitting display device.

In one embodiment of the present invention, as shown in FIG. 6, the pixel define layer 2 is formed of a plurality of accommodation spaces 3 (see FIG. 1C) and a plurality of organic light emitting units 7. The plurality of accommodation spaces 3 and a plurality of organic light emitting units 7 are alternately arranged in the pixel define layer. In the present embodiment shown in FIG. 6, the accommodation spaces 3 are separated from the organic light emitting units 7 such that the water absorbent materials 4 provided within the accommodation spaces 3 are spaced away from the organic light emitting units 7.

In the display device according to embodiments of the present invention, the water absorbent material which is spaced away from the organic light emitting unit is provided in the pixel define layer of the display back plate, accordingly, it enables absorption of water vapour inside the organic light emitting display device without chemical reaction of the water absorbent material with the organic light emitting unit as well as changing original sizes of the pixels in the organic light emitting display device, to prevent the adverse affection of water vapour on performance of the organic light emitting display device, so as to prolong service life of the organic light emitting display device.

Third Embodiment

Figure 7A:
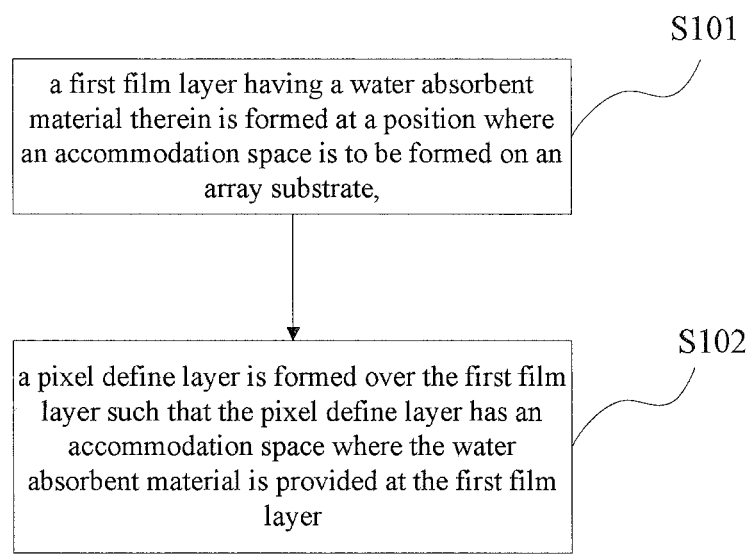
FIG. 7A shows a schematic flowchart of a manufacturing method for a display back plate according to one embodiment of the present invention.

According to the third embodiment of the present invention, as shown in FIG. 7A, a manufacturing method for a display back plate is provided.

The manufacturing method for a display back plate mainly comprises the following steps.

In S101, at a position where an accommodation space is to be formed on an array substrate, a first film layer having a water absorbent material therein is formed.

In one embodiment of the present invention, a film layer mixed with a water absorbent material may be formed on the array substrate. Then, the first film layer is patterned in accordance with a pattern for the accommodation space to be formed, so that the first film layer is formed at the position where the accommodation space is to be formed, here, shape of the first film layer is the same as that of the accommodation space to be formed.

In S102, a pixel define layer is formed on the first film layer, the pixel define layer enveloping over the patterned first film layer such that an accommodation space corresponding to the patterned first film layer is formed in the pixel define layer.

In one embodiment of the present invention, once the array substrate has formed with the first film layer thereon, the pixel define layer is manufactured, so that the accommodation space is formed directly in the pixel define layer at a position where the first film layer has been formed so as to envelope over the first film layer with water absorbent performance.

In the manufacturing method for a display back plate according to embodiments of the present invention, a process where the first film layer including the water absorbent material is firstly formed and then the pixel define layer is formed allows the accommodation space to be formed directly in the pixel define layer at a position where the first film layer has been formed so as to envelope over the first film layer with water absorbent performance. The process is simple.

Figure 7B:
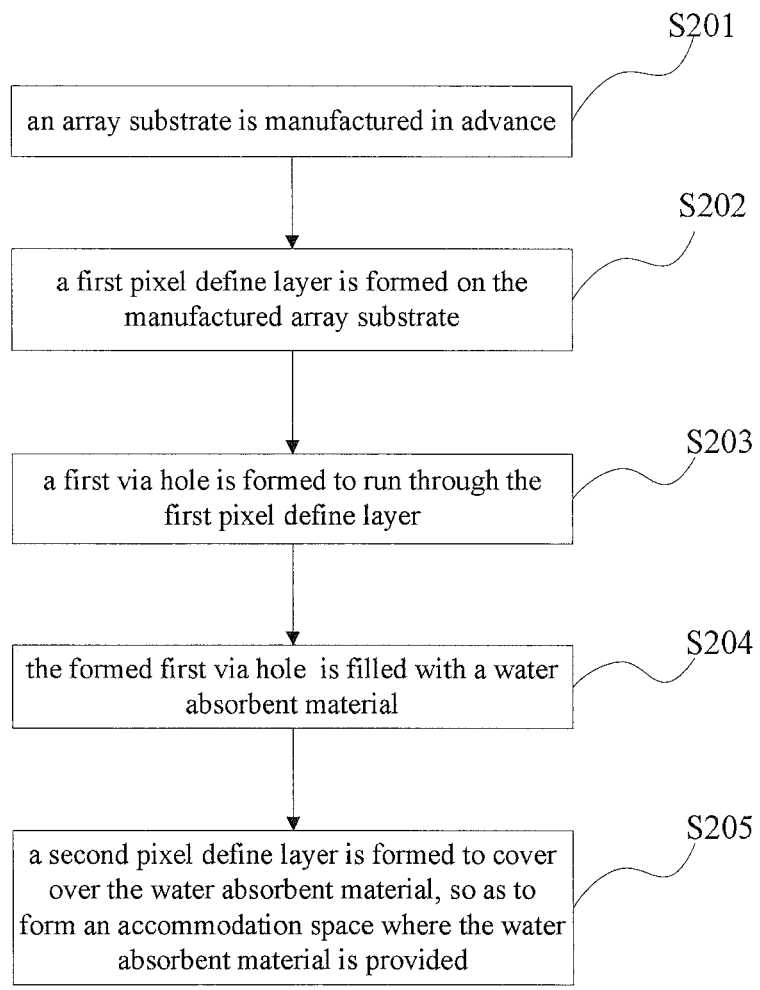
FIG. 7B shows a schematic flowchart of a manufacturing method for a display back plate according to another embodiment of the present invention.

Of course, if it is permitted by the process conditions, in another embodiment of the present invention, a manufacturing method shown in FIG. 7B may be used. The method mainly comprises the following steps.

In S201, an array substrate is manufactured in advance.

In detail, the array substrate according to the present embodiment of the invention is embodied as a TFT substrate. According to embodiments of the present invention, the TFT substrate may be manufactured by using exiting processes, and the description thereof will be omitted herein.

In S202, a first pixel define layer is formed on the manufactured array substrate.

In detail, material for forming the pixel define layer is laid on the manufactured array substrate by means of deposition, spin-coating or spray coating. The material may be Acrylic material or may be resin material, however, it is not limited herein. According to the present embodiment of the invention, the first pixel define layer is formed by performing a patterning process on the laid pixel define layer.

In S203, a first via hole is formed to run through the first pixel define layer.

According to embodiments of the present invention, the accommodation space may be manufactured in various manners, and shape of the manufactured accommodation space may also vary in accordance with actual conditions. The accommodation space has an opening formed in an upper surface and/or a lower surface of the pixel define layer. The accommodation space is separated from the organic light emitting unit of the pixel define layer such that the water absorbent material within the accommodation space is spaced away from the organic light emitting unit.

Moreover, the accommodation space according to the present embodiment of the invention may be manufactured by suitably selecting different manufacturing processes in accordance with structure of the pixel define layer and shape of the accommodation space to be formed.

In the present embodiment of the invention, after manufacturing the first pixel define layer, a patterning process is performed on the first pixel define layer to form a first via hole running through the first pixel define layer along a direction perpendicular to the array substrate so as to form the accommodation space.

In S204, the first via hole formed at S203 is filled with a water absorbent material.

In detail, according to the present embodiment of the invention, after manufacturing the first via hole, the water absorbent material may be filled into the manufactured first via hole and then is dried.

The water absorbent material according to the present embodiment of the invention may be desiccant of metal oxide, e.g., calcium oxide (CaO), magnesium oxide (MgO) or barium oxide (BaO), etc., or may be desiccant of organic material, or may be the material, for forming the pixel define layer, which is mixed with the above metal oxide(s).

In the present embodiment of the invention, during the step S203 of filling the manufactured first via hole with the water absorbent material, the water absorbent material may be filled into the whole first via hole, to finally achieve the structure shown in FIG. 2B; or, the water absorbent material may be filled into the first via hole partially, to finally achieve the structure shown in FIG. 1B.

In S205, a second pixel define layer is formed to cover over the water absorbent material.

According to embodiments of the present invention, material for forming the second pixel define layer may be the same as or different from that for forming the first pixel define layer. If the material for forming the second pixel define layer is the same as that for forming the first pixel define layer, the structure of the pixel define layer shown in FIG. 1B is achieved; and, if the material for forming the second pixel define layer is different from that for forming the first pixel define layer, the structure of the pixel define layer shown in FIG. 2B is achieved.

In the present embodiment of the invention, the first via hold formed in the first pixel define layer serves as the required accommodation space, which runs through the lower surface of the pixel define layer, has an opening toward the upper surface of the array substrate and has the ability of absorbing the water vapour emitted from the array substrate.

Figure 7C:
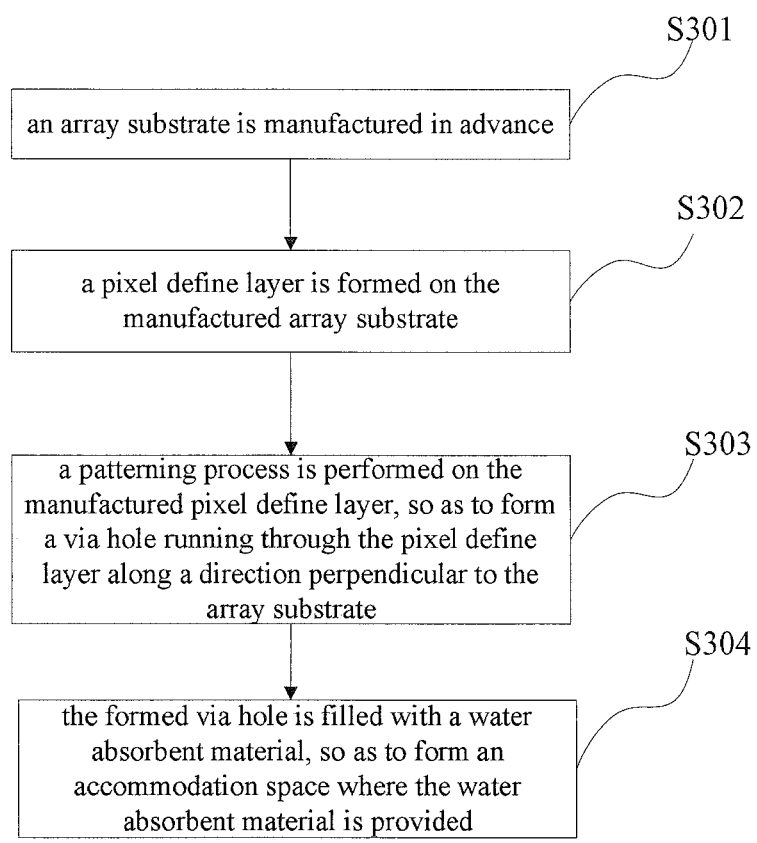
FIG. 7C shows a schematic flowchart of a manufacturing method for a display back plate according to still another embodiment of the present invention.

According to another embodiment of the present invention, if an accommodation space running through the whole pixel define layer is required to be formed, a manufacturing method shown in FIG. 7C may be used. The method mainly comprises the following steps.

In S301, an array substrate is manufactured in advance.

In S302, a pixel define layer is formed on the manufactured array substrate.

In S303, a patterning process is performed on the pixel define layer manufactured in the step S302, so as to form a via hole running through the pixel define layer along a direction perpendicular to the array substrate.

In S304, the via hole formed at S303 is filled with a water absorbent material.

The accommodation space obtained by the above manufacturing method runs through the whole pixel define layer, which enables a good absorption of water vapour inside the display device.

It should be noted that, each accommodation space formed according to the embodiments of the present invention may comprise at least one via hole. For the purpose of simplifying the process, preferably, each accommodation space comprises one via hole.

Although it is not illustrated in the figures, another manufacturing method for a display back plate according to another embodiment of the present invention is provided. This method mainly comprises the following steps:

providing an array substrate;

forming a first pixel define layer on the array substrate;

forming a second pixel define layer on the first pixel define layer;

forming, in the second pixel define layer, a second via hole running through the second pixel define layer along a direction perpendicular to the array substrate; and filling the second via hole with a water absorbent material.

It should be noted that, the above manufacturing methods for a display back plate according to embodiments of the present invention is described only for representative purpose, and should not be limited to those set forth herein, as long as the accommodation space for accommodating the water absorbent material therein according to embodiments of the present invention is obtained.

The manufacturing method for a display back plate according to embodiments of the present invention comprises a step of forming an accommodation space where a water absorbent material is accommodated, accordingly, the display back plate manufactured by this method enables a good absorption of water vapour generated inside the organic light emitting display device, to prevent the adverse affection of water vapour on performance of the organic light emitting display device, so as to prolong service life of the organic light emitting display device. Furthermore, according to embodiments of the present invention, the water absorbent material is placed within the pixel define layer, which enables the absorption of water vapour generated inside the organic light emitting display device without changing original sizes of the pixels in the organic light emitting display device.

Although exemplary embodiments of the present invention have been described in detail with reference to the attached drawings, the present invention may, however, be embodied in many different forms and should not be construed as being limited to the embodiment set forth herein.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A display back plate, comprising:
an array substrate;
a patterned first film layer formed on the array substrate; and
a pixel define layer enveloping over the patterned first film layer and for defining an organic light emitting unit;
wherein:
the pixel define layer is provided with an accommodation space therein within which a water absorbent material is provided, and, the accommodation space corresponds to the patterned first film layer;
the accommodation space has an opening formed in an upper surface and/or a lower surface of the pixel define layer;
the accommodation space is separated from the organic light emitting unit such that the water absorbent material within the accommodation space is spaced away from the organic light emitting unit.

2. The display back plate according to claim 1, wherein:
the accommodation space is formed to run through the upper surface and the lower surface of the pixel define layer in a direction perpendicular to the array substrate.

3. The display back plate according to claim 1, wherein:
a plurality of the accommodation spaces and a plurality of the organic light emitting units are formed to be alternately arranged in the pixel define layer.

4. The display back plate according to claim 3, wherein:
each of the accommodation spaces is formed by one or more via holes formed in the pixel define layer.

5. A display device, comprising the display back plate according to claim 1.

6. The display back plate according to claim 1, wherein:
the accommodation space comprises a via hole running through the pixel define layer in a direction perpendicular to the array substrate.

7. The display back plate according to claim 1, wherein:
the pixel define layer comprises a first pixel define layer and a second pixel define layer provided on the array substrate successively from the bottom up.

8. The display back plate according to claim 7, wherein:
the accommodation space comprises a first via hole running through the first pixel define layer in a direction perpendicular to the array substrate.

9. The display back plate according to claim 7, wherein:
the accommodation space comprises a via hole running through the first and the second pixel define layers in a direction perpendicular to the array substrate.

10. A manufacturing method for a display back plate, the method comprising:
providing an array substrate;
forming a first film layer having water absorbent performance on the array substrate, and patterning the first film layer in accordance with a predetermined pattern; and
forming a pixel define layer on the patterned first film layer, the pixel define layer enveloping over the patterned first film layer such that an accommodation space corresponding to the patterned first film layer is formed in the pixel define layer;
wherein, the accommodation space is separated from an organic light emitting unit in the pixel define layer such that the first film layer having water absorbent performance and accommodated within the accommodation space is spaced away from the organic light emitting unit.

11. The method according to claim 10, wherein:
the first film layer comprises a film layer mixed with a water absorbent material.

12. The method according to claim 10, wherein:
a plurality of the accommodation spaces and a plurality of the organic light emitting units are formed to be alternately arranged in the pixel define layer; and
each of the accommodation spaces is formed by one or more via holes formed in the pixel define layer.

13. The method according to claim 10, wherein:
the accommodation space comprises a via hole running through the pixel define layer in a direction perpendicular to the array substrate.

14. The method according to claim 10, wherein:
the pixel define layer comprises a first pixel define layer and a second pixel define layer provided on the array substrate successively from the bottom up.

* * * * *